US010282657B2

United States Patent
Pantazi et al.

(10) Patent No.: US 10,282,657 B2
(45) Date of Patent: May 7, 2019

(54) NEUROMORPHIC SYNAPSES

(71) Applicant: INTERNATIONAL BUSINESS MACHINES CORPORATION, Armonk, NY (US)

(72) Inventors: Angeliki Pantazi, Rueschlikon (CH); Abu Sebastian, Rueschlikon (CH); Evangelos S. Eleftheriou, Rueschlikon (CH); Tomas Tuma, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 726 days.

(21) Appl. No.: 14/868,761

(22) Filed: Sep. 29, 2015

(65) Prior Publication Data
US 2016/0125287 A1 May 5, 2016

(30) Foreign Application Priority Data

Oct. 30, 2014 (GB) .................................. 1419355.1

(51) Int. Cl.
*G06N 3/063* (2006.01)
*G06N 3/04* (2006.01)
*G06N 3/08* (2006.01)

(52) U.S. Cl.
CPC ............. *G06N 3/049* (2013.01); *G06N 3/063* (2013.01); *G06N 3/088* (2013.01)

(58) Field of Classification Search
CPC ..................................................... G06N 3/063
(Continued)

(56) References Cited

U.S. PATENT DOCUMENTS

2009/0076993 A1 3/2009 Anathanarayanan et al.
2010/0299297 A1 11/2010 Breitwisch et al.
(Continued)

FOREIGN PATENT DOCUMENTS

WO 2012089360 A1 7/2012

OTHER PUBLICATIONS

Jo, Nanoscale Memristive Devices for Memory and Logic Applications, Doctoral Thesis, University of Michigan, 2010, pp. 1-153.*
(Continued)

*Primary Examiner* — Wilbert L Starks
(74) *Attorney, Agent, or Firm* — Cantor Colburn LLP; Abdy Raissinia

(57) ABSTRACT

A neuromorphic synapse with a resistive memory cell connected in circuitry having first and second input terminals. The input terminals respectively receive pre-neuron and post-neuron action signals, each having a read portion and a write portion, in use. The circuitry includes an output terminal for providing a synaptic output signal which is dependent on resistance of the memory cell. The circuitry is configured such that the synaptic output signal is provided at the output terminal in response to application at the first input terminal of the read portion of the pre-neuron action signal, and such that a programming signal, for programming resistance of the memory cell, is applied to the cell in response to simultaneous application of the write portions of the pre-neuron and post-neuron action signals at the first and second input terminals respectively. The synapse can be adapted for operation with identical pre-neuron and post-neuron action signals.

19 Claims, 10 Drawing Sheets

(58) Field of Classification Search
USPC .................................................. 706/26, 45
See application file for complete search history.

(56) References Cited

U.S. PATENT DOCUMENTS

| | | |
|---|---|---|
| 2013/0159229 A1 | 6/2013 | Modha |
| 2014/0081893 A1 | 3/2014 | Modha |
| 2014/0114893 A1 | 4/2014 | Arthur et al. |
| 2014/0310216 A1 | 10/2014 | Sarah et al. |

OTHER PUBLICATIONS

Jo, Nanoscale Memristive Devices for Memory and Logic Applications, Doctoral Thesis, University of Michigan, 2010, pp. 1-153 (Year: 2010).*
International Search Report and Written Opinion for International Application No. PCT/IB2015/057824; Filing Date: Oct. 13, 2015; dated Jan. 27, 2016; 16 pgs.

* cited by examiner

WRITE PORTION: melt – crystallization by varying pulse duration

WRITE PORTION: melt – crystallization by varying pulse duration - melt

NEUROMORPHIC SYNAPSES

FOREIGN PRIORITY

This application claims priority to Great Britain Patent Publication No. 1419355.1 filed Oct. 30, 2014, and all the benefits accruing therefrom under 35 U.S.C. § 119, the contents of which in its entirety are herein incorporated by reference.

BACKGROUND

This invention relates generally to neuromorphic synapses and, more specifically to, neuromorphic synapses based on resistive memory cells.

Neuromorphic technology relates to computing systems which are inspired by biological architectures of the nervous system. Conventional computing architectures are becoming increasingly inadequate to meet the ever-expanding processing demands placed on modern computer systems. Compared to the human brain, the classical von Neumann computer architecture is highly inefficient in terms of power consumption and space requirements. The human brain occupies less than 2 liters and consumes around 20 W of power. Simulating 5 seconds of brain activity using state-of-the-art supercomputers takes around 500 s and needs 1.4 MW of power. These issues have prompted a significant research effort to understand the highly efficient computational paradigm of the human brain and to create artificial cognitive systems with unprecedented computing power.

Neurons and synapses are two basic computational units in the brain. A neuron can integrate inputs coming from other neurons, in some cases with further inputs, for example from sensory receptors, and generates output signals known as "action potentials" or "spikes". The synapses change their connection strength as a result of neuronal activity. FIG. 1 of the accompanying drawings shows a schematic representation of a synapse 1 located between two neurons 2. The synapse 1 receives action potentials generated by a pre-synaptic neuron ("pre-neuron") N1 and provides output signals to a post-synaptic neuron ("post-neuron") N2. The pre-neuron action potential is conveyed to synapse 1 via an axon 3 of neuron N1. The resulting synaptic output signal is a graded synaptic potential which depends on conductance (also known as "synaptic weight" or "strength") of the synapse. Synaptic weight can be enhanced or reduced by neuronal activity, and this "plasticity" of synapses is crucial to memory and other brain functions. This effect is indicated in FIG. 1 by back-propagation of the post-neuron action potential, i.e. a spike generated by neuron N2, to the synapse 1 via a dendrite 4 of neuron N2.

The action potentials in biological systems have the same shape at all instances of neuronal firing (spike generation). There is no information in the spike shape but only in the firing time. In particular, synaptic weight can be modified in dependence on relative timing of the pre-neuron and post-neuron action potentials. In a simple model here, synapses become increasingly stronger (more conductive) if the pre- and post-neurons fire together. Change in synaptic weight may also depend on slight differences in timing of the pre- and post-neuron spikes. For example, synaptic weight may increase if the post-neuron tends to fire just after the pre-neuron, and decrease if the post-neuron tends to fire just before the pre-neuron. These relative timing effects are known generally as spike-timing dependent plasticity (STDP).

Synapses typically outnumber neurons by a significant factor (approximately 10,000 in the case of the human brain). A key challenge in neuromorphic computation technology is the development of compact nanoelectronic devices that emulate the plasticity of biological synapses.

SUMMARY

Embodiments include a neuromorphic synapse having a resistive memory cell connected by circuitry. The circuitry includes first and second input terminals for respectively receiving pre-neuron and post-neuron action signals each having a read portion and a write portion and an output terminal for providing a synaptic output signal dependent on resistance of the resistive memory cell. The circuitry is configured such that said synaptic output signal is provided at the output terminal in response to application at the first input terminal of the read portion of the pre-neuron action signal, and such that a programming signal, for programming resistance of the memory cell, is applied to the cell in response to simultaneous application of the write portions of the pre-neuron and post-neuron action signals at the first and second input terminals respectively.

Embodiments also include a neuromorphic synapse array having a plurality of neuromorphic synapses having a resistive memory cell connected by circuitry, wherein the synapses are assigned to logical rows and columns of the neuromorphic synapse array. The circuitry includes first and second input terminals for respectively receiving pre-neuron and post-neuron action signals each having a read portion and a write portion and an output terminal for providing a synaptic output signal dependent on resistance of the resistive memory cell. The circuitry is configured such that said synaptic output signal is provided at the output terminal in response to application at the first input terminal of the read portion of the pre-neuron action signal, and such that a programming signal, for programming resistance of the memory cell, is applied to the cell in response to simultaneous application of the write portions of the pre-neuron and post-neuron action signals at the first and second input terminals respectively. The first input terminals of synapses in each column of the array are connected to a respective pre-neuron line for supplying a pre-neuron action signal from a corresponding pre-neuron circuit in use. The second input terminals of synapses in each row of the array are connected to a respective post-neuron line for supplying a post-neuron action signal from a corresponding post-neuron circuit in use. The output terminals of synapses in each row are arranged for connection to said corresponding post-neuron circuit for supplying synaptic output signals to that circuit in use

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
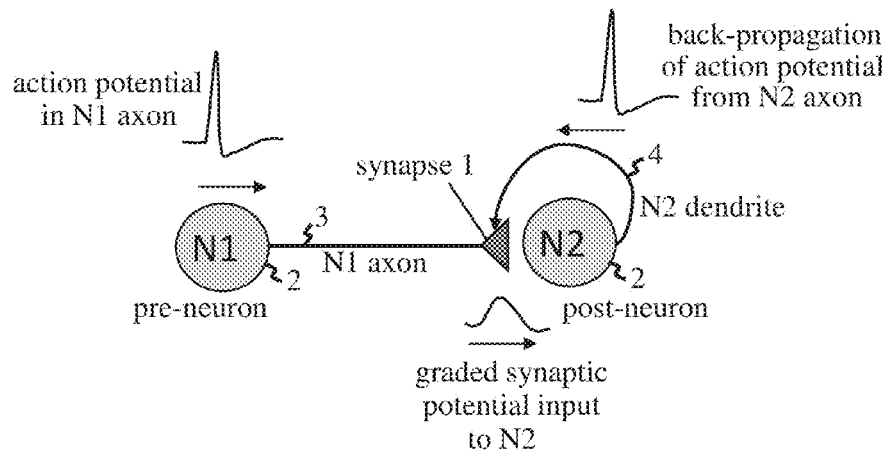
FIG. 1 is a schematic illustration of a biological synapse system.

Neuromorphic synapses embodying the invention thus comprise a three-terminal cell circuit adapted for operation with action signals having two-parts: a read portion and a write portion. Propagation of the synaptic output is emulated by producing the synaptic output signal, which depends on cell resistance, at the output terminal of the circuit. This occurs when the read portion of the pre-neuron action signal is applied to one of the two input terminals. Synaptic weight can be modified by applying a programming signal to the cell to program the cell resistance. This occurs when the write portions of the pre- and post-neuron action signals are applied simultaneously at the two input terminals. The programmed synaptic weight thus depends on relative timing of the pre- and post-neuron action signals, allowing emulation of STDP effects occurring in biological systems. Unlike prior memory cell synapses, however, synapse circuits embodying the invention permit parallel addressing of individual synapses in an array configuration. Hence, synapses in both rows and columns of the array can be programmed in a single step. This allows real-time programming of synapse arrays embodying the invention, providing highly efficient operation and enabling on-chip learning whereby synapse weights evolve dynamically in response to firing of neuron circuits in real-time. This is a major advance over the off-chip addressing required in prior systems, enabling efficient implementation of learning applications such as associative memory. Moreover, unlike prior devices, the synapse circuitry in embodiments of the invention can be adapted for operation with identical pre-neuron and post-neuron action signals. Neuromorphic systems based on these synapses can use identical action signals at all instances of neuron firing, simplifying inter-neuron communications and providing a direct analogy with real biological systems.

The programming signal is produced in response to simultaneous application at the input terminals of the write portions of the pre- and post-neuron action signals, i.e. when both write portions are present at the same time at the input terminals. A programming signal may therefore be produced if there is at least partial overlap in the time periods during which the write portions are applied at their respective input terminals. In embodiments described below, the synapse circuitry is adapted such that the programming signal is applied to the cell during the period of simultaneous application of the write portions at the input terminals, and the programming signal is dependent on shape of at least one of the write portions. These features allow convenient implementation of various STDP effects discussed further below. For example, the write portion of at least one of the action signals may be shaped such that the programming signal varies in dependence on relative timing of the pre- and post-neuron action signals at the input terminals. The write portion may, for instance, have regions of different amplitude and/or duration, and may itself comprise a sequence of pulses.

Many circuit implementations might be envisaged to implement the functionality described for the synapse circuit. In some implementations, however, the circuitry includes a switch set, configurable in dependence on at least one of the action signals, such that the circuitry selectively effects application of said programming signal to the memory cell and provision of said synaptic output signal at the output terminal In effect, such a circuit can selectively assume different arrangements by appropriate configuration of the switch set. In one circuit arrangement, the cell will be operated in a read mode if the read portion of the pre-neuron action signal is present at the first input terminal. This produces the synaptic output signal at the output terminal. In another circuit arrangement, the cell will be operated in a programming mode if the write portions of both the pre-neuron and post-neuron action signal are present at the two input terminals. Operation of the circuit thus depends on the state of the switch set which is controlled in dependence on the action signals at the input terminals. In the embodiments below, the switch set is configurable by either the pre-neuron action signal or a combination of both the pre- and post-neuron action signals. The switch set might in general comprise one or more switches, with some embodiments employing just two switches.

In a particularly compact design, the circuitry includes a first resistance connected between the first input terminal and a first electrode of the memory cell, and a second resistance connected between a second electrode of the memory cell and a reference terminal. The output terminal is connected to the second electrode of the memory cell. The first switch is connected between the second electrode and the reference terminal in parallel to the second resistance, and the second switch is connected between the second input terminal and the first electrode of the memory cell. The circuitry is preferably further adapted such that the first switch is closed during the write portion of the pre-neuron action signal, and the second switch is closed during the write portion of one of the pre-neuron and post-neuron action signals.

An embodiment of a second aspect of the invention provides a neuromorphic synapse array comprising a plurality of neuromorphic synapses according to the first aspect of the invention. The synapses are assigned to logical rows and columns of the array. The first input terminals of synapses in each column are connected to a respective pre-neuron line for supplying a pre-neuron action signal from a corresponding pre-neuron circuit in use. The second input terminals of synapses in each row are connected to a respective post-neuron line for supplying a post-neuron action signal from a corresponding post-neuron circuit in use. The output terminals of synapses in each row are arranged for connection to said corresponding post-neuron circuit for supplying synaptic output signals to that circuit in use.

An embodiment of a third aspect of the invention provides a neuromorphic system comprising a pre-neuron circuit, a post-neuron circuit and a neuromorphic synapse according to the first aspect of the invention. The pre-neuron circuit is connected to the first input terminal of the synapse and is adapted to generate said pre-neuron action signal for supply to the first terminal. The post-neuron circuit is connected to the second input terminal of the synapse and is adapted to generate said post-neuron action signal for supply to the second terminal. The post-neuron circuit is further connected to the output terminal of the synapse for receiving said synaptic output signal.

An embodiment of a fourth aspect of the invention provides a neuromorphic system comprising a neuromorphic synapse array according to the second aspect of the invention and a plurality of neuron circuits. Each neuron circuit is connected to the pre-neuron line for a respective column of the array and is adapted to generate said pre-neuron action signal for synapses in that column, whereby the neuron circuit serves as said pre-neuron circuit for synapses in that column. Each neuron circuit is also connected to the post-neuron line for a respective row of the array and is adapted to generate said post-neuron action signal for synapses in that row, whereby the neuron circuit serves as said post-neuron circuit for synapses in that row. Each neuron circuit is further connected to the output terminals of synapses in said respective row for receiving the synaptic output signals from synapses in that row. With this arrangement, a single action signal generated when a given neuron circuit fires can serve as the pre-neuron action signal for synapses in a given column and also as the post-neuron action signal for synapses in a given row. For reasons discussed earlier, the neuron circuits are preferably adapted such that the pre-neuron and post-neuron action signals are identical (subject, of course, to inherent circuit tolerances and variable effects such as noise).

Resistive memory cells, such as phase-change memory (PCM) cells, are programmable-resistance devices which rely on the variable resistance characteristics of a volume of resistive material disposed between a pair of electrodes. Cell resistance can be controlled by application of control signals to the electrodes. These cells exhibit a threshold-switching effect whereby the cell can be switched between high and low resistance states by applying a control signal above a threshold level. By appropriate adjustment of the control signals, cells may be programmed to a range of intermediate resistance values. In PCM cells, for example, the programmable-resistance is achieved by heating a volume of chalcogenide material so as to change the relative proportions of a (high-resistance) amorphous phase and a (low-resistance) crystalline phase in the chalcogenide volume. To change the cell-resistance, a programming (or "write") signal above the threshold voltage required for phase-change is applied to the cell via the electrodes. The cell-resistance can be measured (or "read") by applying a low-voltage read signal to the electrodes and measuring the resulting current flow through the cell. The read voltage level is low enough to ensure that the read voltage does not disturb the programmed cell-state.

Figure 2:
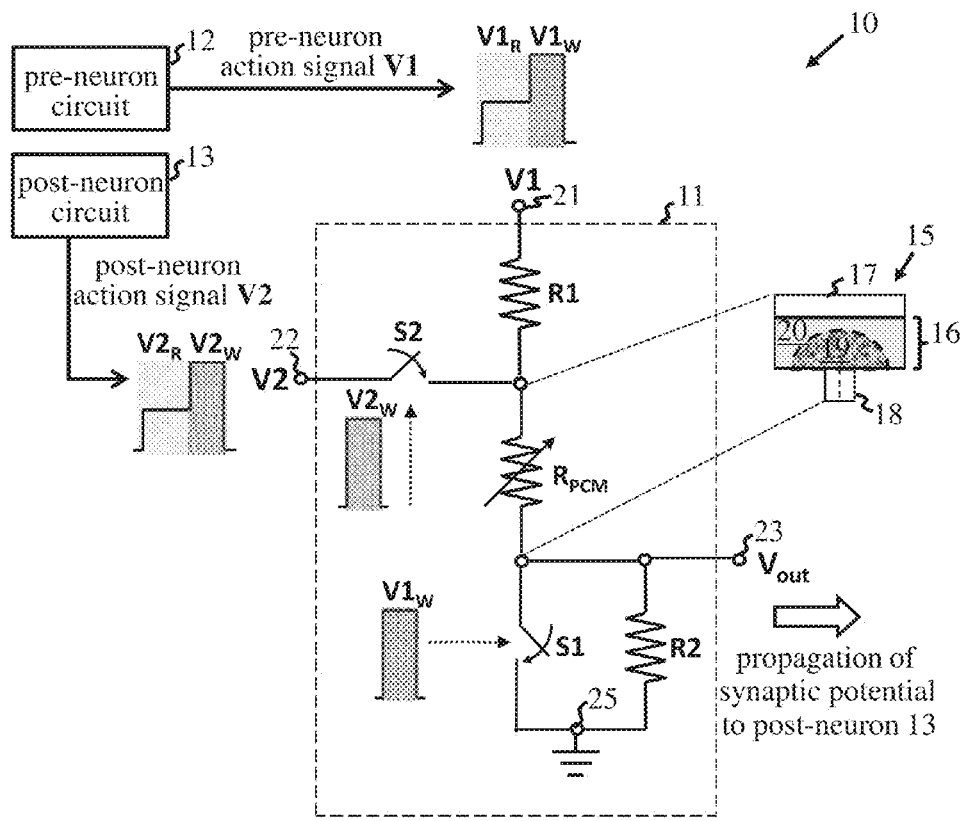
FIG. 2 is a schematic representation of a neuromorphic system including a synapse embodying the invention.

FIG. 2 shows a schematic circuit diagram for a neuromorphic system 10 embodying the invention. The system 10 comprises a synapse, indicated generally at 11, connected between a pre-neuron circuit 12 and a post-neuron circuit 13. The synapse 11 includes a resistive memory cell, here a PCM cell 15, which is represented in the circuit as a variable resistance RPCM. As indicated schematically by the enlargement in the figure, PCM cell 15 comprises a volume of chalcogenide compound 16 disposed between a first, "upper" electrode 17 and a second, "lower" electrode 18. Lower electrode 18 has a smaller contact area with chalcogenide 16 than upper electrode 17 in this particular "mushroom cell" configuration. The variable-resistance properties of PCM cell 15 result from varying the relative proportions of a high-resistance amorphous phase 19 and a low-resistance crystalline phase 20 of the chalcogenide material 16. In the embodiment to be described, it is assumed that the cell 15 is in the fully-amorphous, high-resistance ("RESET") state prior to operation.

The PCM cell 15 of synapse 11 is connected in circuitry having a first input terminal 21 for receiving a pre-neuron action signal V1 from pre-neuron circuit 12. The circuitry also has a second input terminal 22 for receiving a post-neuron action signal V2 from post-neuron circuit 13. The circuitry has an output terminal 23 at which a synaptic output signal, dependent on resistance of PCM cell 15, is provided in operation. The synapse circuitry further includes a switch set, comprising a first switch S1 and a second switch S2, and first and second resistances represented by resistors R1 and R2. The first resistor R1 is connected between the first input terminal 21 and the upper electrode 17 of PCM cell 15. The second resistor R2 is connected between the lower electrode 18 of the cell and a reference terminal 25 which provides a reference level for circuit operation, here a signal earth. The output terminal 23 is also connected to the lower electrode 18 of the PCM cell 15. The first switch S1 is connected between the lower electrode 18 and the reference terminal 25 in parallel to the second resistor R2. The second switch S2 is connected between the second input terminal 22 and the upper electrode 17 of the PCM cell. Switches S1 and S2 may be realized by transistors or diodes for example, and circuitry 11 can be fabricated as an integrated nanoelectronic circuit using well-known material processing techniques.

The action signals V1 and V2 generated by neuron circuits 12, 13 each have a stepped shape with an initial read portion V1R, V2R and a subsequent write portion V1W, V2W. The state of switches S1 and S2 is configurable in dependence on at least one of the action signals V1 and V2. In the FIG. 2 embodiment, the write portions V1W, V2W of the action signals provide control signals for the switches as indicated by the dotted arrows in the figure. The first switch Si is closed during the write portion V1W of the pre-neuron action signal V1. The second switch S2 is closed during the write portion V2W of the post-neuron action signal V2. Depending on the switch configuration, the synapse circuitry can selectively effect (a) application to PCM cell 15 of a programming signal for programming resistance of the cell, and (b) application to the cell of a read signal which produces the synaptic output signal at output terminal 23. More particularly, through operation of the control signals on switches S1, S2 in the circuit arrangement shown, the synapse circuitry is operable such that: (a) the synaptic output signal is provided at output terminal 23 in response to application at the first input terminal 21 of the read portion V1R of the pre-neuron action signal V1; and (b) a programming signal is applied to the cell in response to simultaneous application of the write portions V1W, V2W of the pre- and post-neuron action signals at the first and second input terminals respectively.

The synapse circuitry is adapted to operate with pre- and post-neuron action signals V1 and V2 which are identical (subject to inherent circuit tolerances and variable effects such as noise), each signal having the same stepped shape as indicated in FIG. 2. The read portions V1R, V2R of the action signals are of lower amplitude than the write portions V1W, V2W. This facilitates exploitation by the synapse circuit of the threshold-switching characteristic of PCM cell 15 whereby, if a voltage less than a certain threshold switching voltage is applied to the cell, the current will be so small that there will be very little Joule heating and substantially no phase change in the cell volume. Above the threshold switching voltage, cell resistance drops to a very low value that enables phase change. Application of a programming pulse with a certain input power and duration can cause partial crystallization of the amorphous region, with a consequent reduction in cell resistance.

Figures 3A, 3B, 3C:
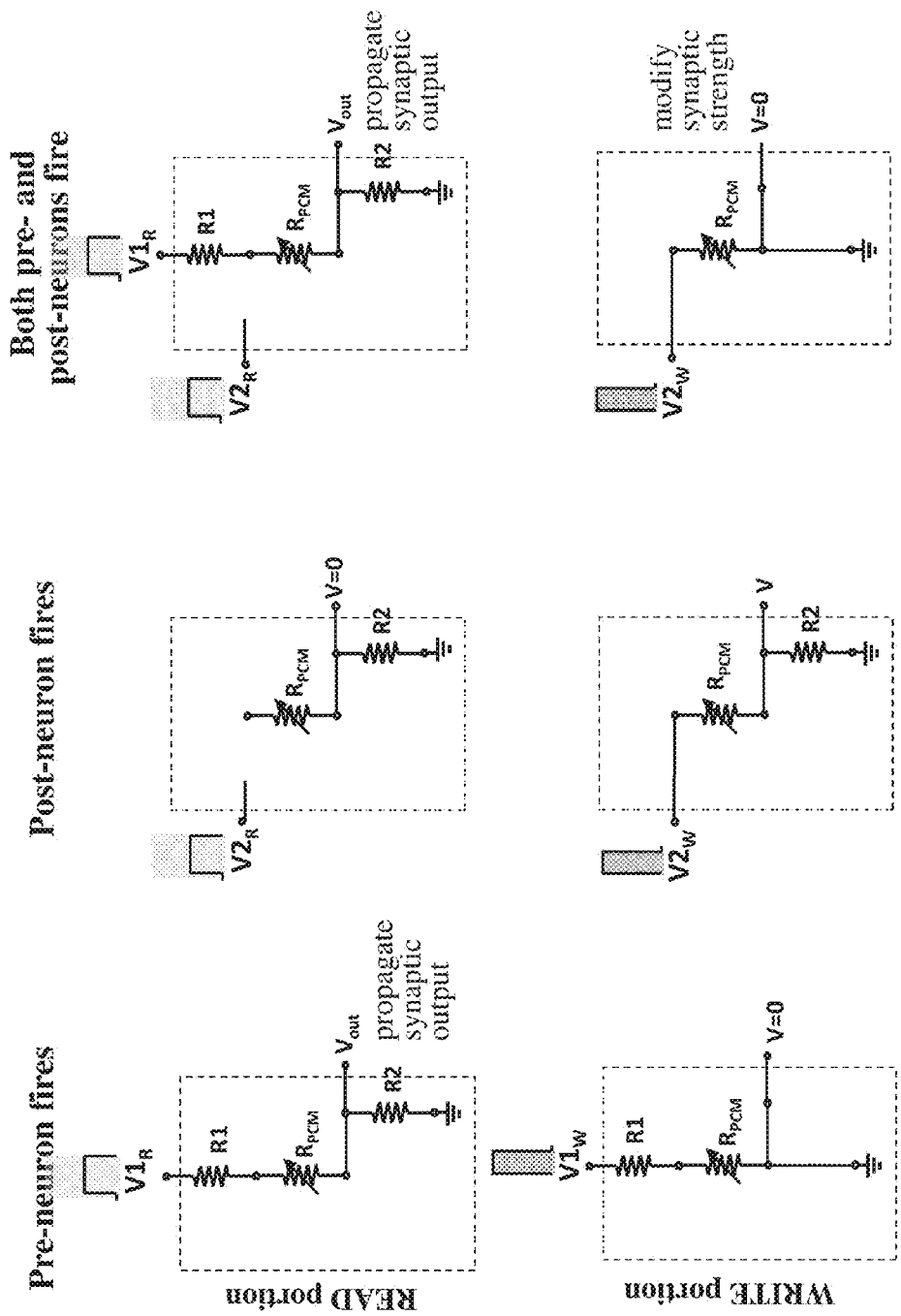
FIGS. 3a, 3b and 3c illustrate operation of the synapse of FIG. 2 in response to pre- and post-neuron action signals.

FIGS. 3a to 3c indicate operation of the synapse 11 in different neuronal firing scenarios. FIG. 3a shows the circuit configuration when only the pre-neuron circuit 12 fires. The upper portion of this figure shows the configuration on application of the read portion V1R of action signal V1 at the input terminal 21. Both S1 and S2 are open, and V1R at terminal 21 effects a read mode of operation in which a read voltage is dropped across cell 15. Due to the low amplitude of read portion $V1_R$, this read voltage is sufficiently low that no change in cell-resistance can occur. The resulting current I flowing through the cell is given by:

$$I = \frac{V1_R}{R1 + R_{PCM} + R2}.$$

This produces a synaptic output signal $V_{out}$ which is dependent on the cell resistance $R_{PCM}$ and is given by:

$$V_{out} = \left(\frac{R2}{R1 + R_{PCM} + R2}\right)V1_R.$$

This output signal $V_{out}$ represents the graded synaptic potential which is propagated on to the post-neuron circuit 13.

The lower portion of FIG. 3a shows the configuration on application of the write portion $V1_W$ of action signal V1 at the input terminal 21. S2 is open but S1 is closed, shorting resistance R2. The voltage to output terminal 23 is thus 0V, and there is no propagation of synaptic potential to post-neuron 13. The cell current is given by:

$$I = \frac{V1_W}{R1 + R_{PCM}}.$$

However, the resistance R1 is selected such that this cell current is insufficient to change cell-resistance. Hence, there is no modification of synaptic strength due to firing of pre-neuron 12 alone.

FIG. 3b shows the circuit configuration when only the post-neuron circuit 13 fires. The upper portion of this figure shows the configuration on application of the read portion $V2_R$ of action signal V2 at the input terminal 22. Both S1 and S2 are open, whereby no current flows in the circuit and the voltage at output terminal 23 is 0V. The lower portion of this figure shows the configuration on application of the write portion $V2_W$ of action signal V2 at input terminal 22. S1 is open and S2 is closed. The resulting cell current is given by:

$$I = \frac{V2_W}{R_{PCM} + R2}.$$

The resistance R2 is selected such that this cell current is insufficient to change cell-resistance. Hence, there is no modification of synaptic strength due to firing of post-neuron 13 alone. The voltage V at output terminal 23 is given by:

$$V = \left(\frac{R2}{R_{PCM} + R2}\right)V2_W.$$

In this embodiment, post-neuron circuit 13 is adapted to disable its input from synapse 11 during the write portion $V2_W$. This prevents propagation of any synaptic output due to the output voltage V here.

FIG. 3c shows the circuit configuration when the pre-neuron and post-neuron circuits fire together such that action signals V1 and V2 are applied simultaneously to the synapse input terminals. The upper portion of the figure shows the configuration on application of the read portions V1R and $V2_R$ at terminals 21 and 22 respectively. Both S1 and S2 are open, and the resulting operation is identical to that of FIG. 3a. Hence, cell 15 is operated in a read mode and a synaptic output signal $$V_{out} = \left(\frac{R2}{R1 + R_{PCM} + R2}\right)V1_R$$

is propagated to post-neuron circuit 13. The lower portion of the figure shows the configuration on simultaneous application of the write portions $V1_W$ and $V2_W$ at input terminals 21, 22. Switch S1 is closed, shorting resistance R2. The voltage at output terminal 23 is thus 0V, and there is no propagation of synaptic potential to post-neuron 13. Here, however, switch S2 is also closed, isolating resistance R1. This effects a programming mode of operation in which $V2_W$ is applied to the cell as a programming signal, resulting in a cell current:

$$I = \frac{V2_W}{R_{PCM}}.$$

The amplitude of write portion $V2_W$ is above the level required for threshold switching, whereby the cell current effects re-programming of the cell resistance. The operating parameters in this embodiment are set such that application of the programming signal $V2_W$ produces an incremental reduction in cell-resistance. In particular, with cell 15 in the high-resistance RESET state prior to synapse operation, the accumulation characteristic of the cell means that cell-resistance will gradually decrease towards the fully-crystalline, low-resistance "SET" state with successive applications of the programming signal V2W. Hence, synaptic weight will gradually increase with successive simultaneous firings of the pre-and post-neuron circuits.

It will be seen from the above that write portion of the action signal format is used to implement the synaptic learning function by programming cell resistance. The read portion is used to propagate the synaptic potential to the post-neuron in the read mode. The switches S1 and S2 are used to distinguish between read and write (programming) events. Resistances R1 and R2 are selected such that synaptic change, due to re-programming of the cell, is inhibited if only one of the pre- and post-neuron action signals is present at the input terminals.

Figure 4:
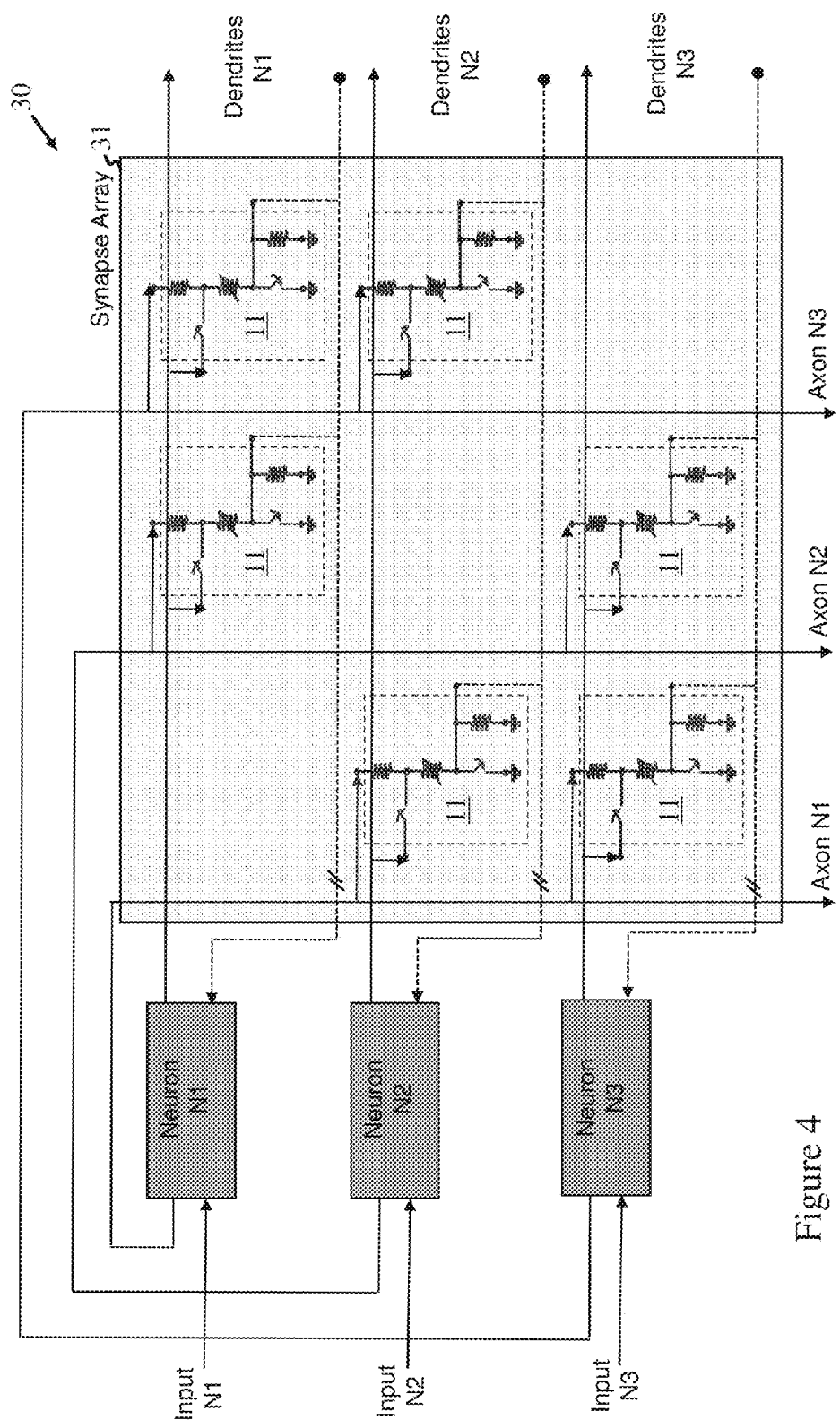
FIG. 4 is a schematic illustration of a neuromorphic system based on a synapse array embodying the invention.

Synapse 11 provides a compact neuromorphic synapse configuration enabling neuromorphic systems to use identical action signals at all instances of neuronal firing. This dramatically simplifies inter-neuron communications. Moreover, if synapse 11 is used in an array configuration, then synapses in rows and columns can be addressed simultaneously. FIG. 4 shows a simple example of a neuromorphic system 30 comprising three neuron circuits N1, N2 and N3 interconnected via a synapse array 31. The array 31 comprises six synapses 11, arranged in three rows and three columns, with each synapse being connected between a respective pair of pre-and post-neuron circuits. (It will of course be appreciated that array 31 need not necessarily be configured as a regular arrangement of rows and columns of synapses. Synapses can be connected as described, with their assignment to logical rows and columns being determined by the neuron pairs between which they are connected. The terms "row" and "column" are thus logical designations only and are effectively interchangeable). In the arrangement shown, the first input terminals 21 of synapses in each column are connected to a respective pre-neuron line for supplying a pre-neuron action signal from a corresponding pre-neuron circuit in operation. The pre-neuron lines, arranged vertically in FIG. 4, correspond to the axons of neurons N1 to N3 and are labelled as such in the figure. The second input terminals of synapses in each row are connected to a respective post-neuron line for supplying a post-neuron action signal from a corresponding post-neuron circuit in use. The post-neuron lines are shown as solid horizontal lines in the figure. These correspond to the post-neuron output dendrites for back-propagation of action signals from the post-neurons. The output terminals 23 of the synapses in each row are connected to their corresponding post-neuron circuits for supplying synaptic output signals to these circuits in operation. These connections, which correspond to the post-neuron input dendrites for receiving the synaptic outputs, are represented by the dashed horizontal lines in the figure. Each neuron circuit N1 to N3 is thus connected via its axon line to a respective column of the array and generates pre-neuron action signals for synapses in that column. Each circuit N1 to N3 is also connected via its output dendrite line to a respective row of the array and generates post-neuron action signals for synapses in that row. Each circuit N1 to N3 is further connected to the output terminals of synapses in its corresponding row for receiving synaptic output signals from synapses in that row.

In the system of FIG. 4, a single action signal generated when a given neuron circuit N1 to N3 fires can serve as both the pre-neuron action signal for synapses in a given column and the post-neuron action signal for synapses in a given row. Synapses in rows and columns can be addressed in a single cycle, whereby all (or any subset of) synapses in the array can be addressed in parallel. This allows synapse updates to be performed in real-time, the synapse weights evolving dynamically with firing of the neuron circuits. Synapse arrays embodying the invention thus provide for efficient implementation of on-chip learning applications.

Figure 5:
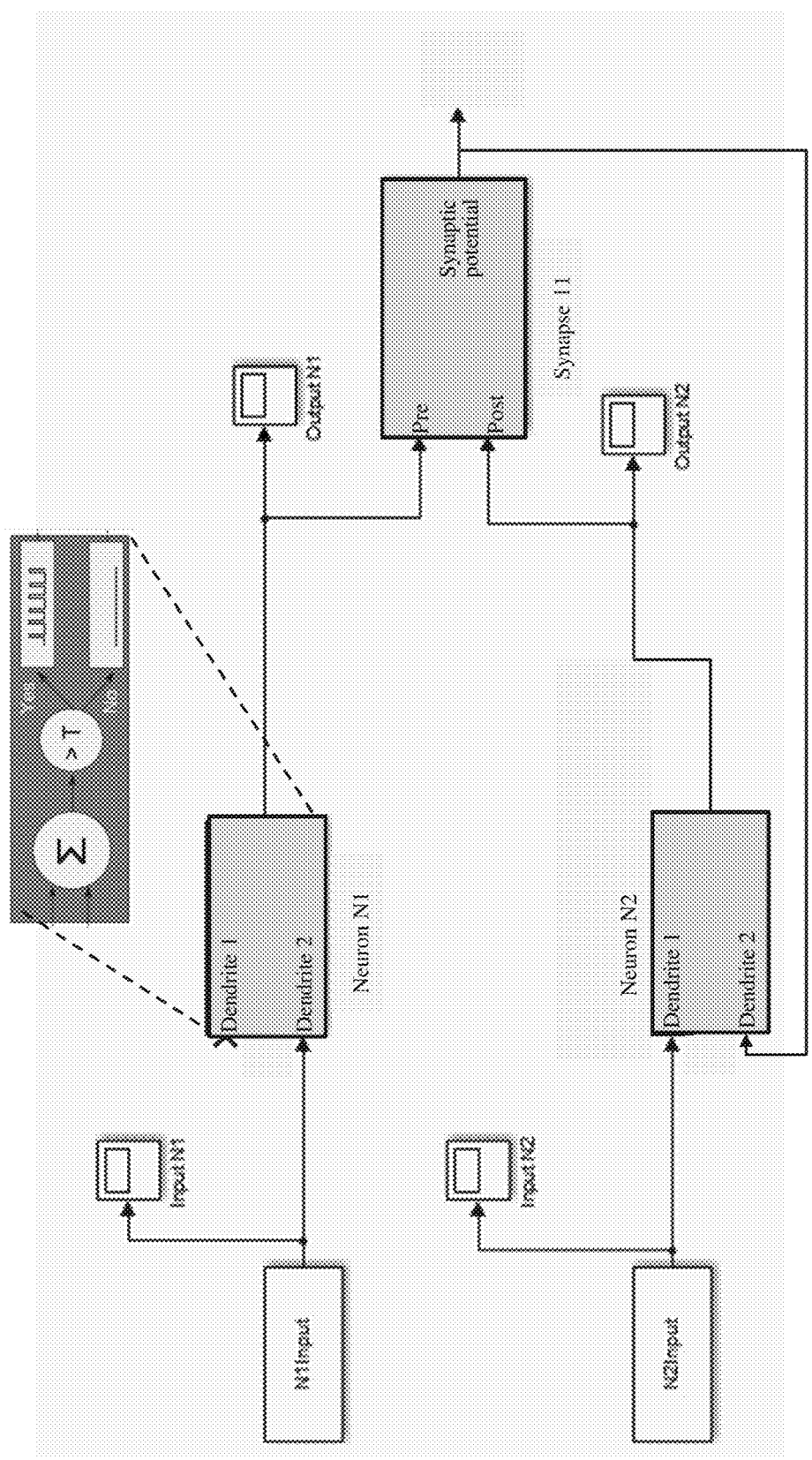
FIG. 5 illustrates structure of a simulation model for simulating operation of the FIG. 2 synapse system.
Figure 6:
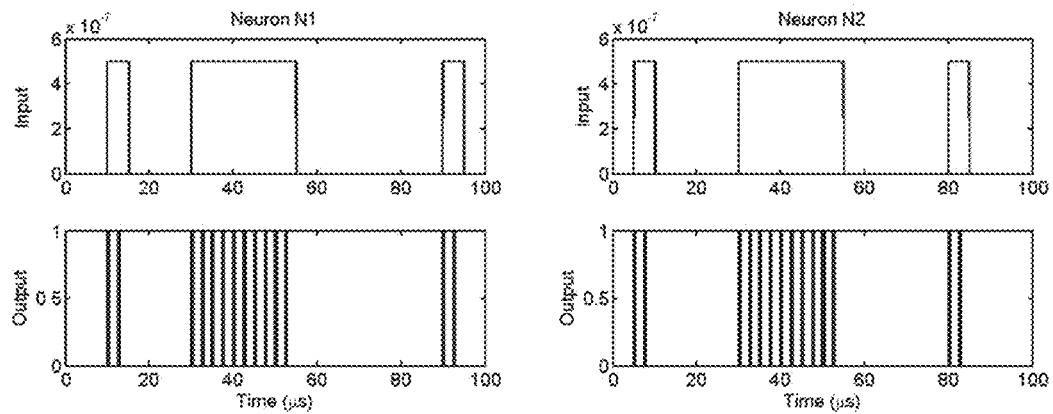
FIG. 6 illustrates inputs and outputs of neuron circuits in the FIG. 5 model.
Figure 7A:
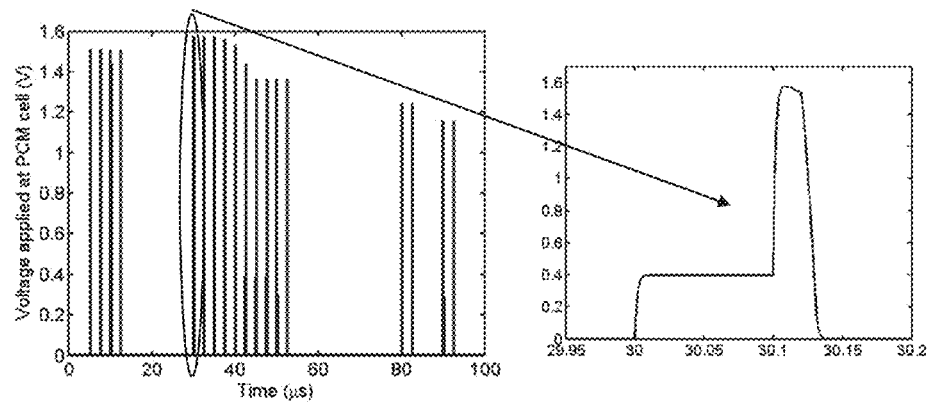
FIGS. 7a and 7b illustrate resulting operation of the synapse in the model.
Figure 7B:
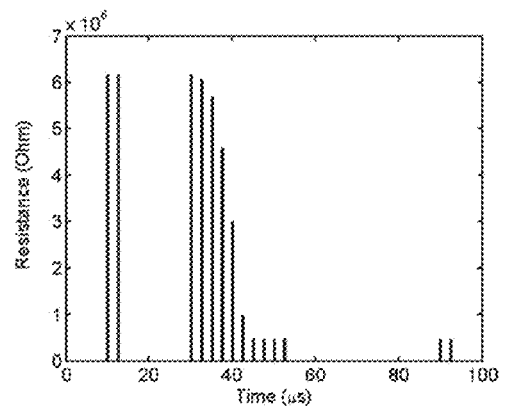

Successful operation of neuromorphic systems based on synapse 11 is clearly demonstrated by simulations illustrated in FIGS. 5 to 9. FIG. 5 shows basic structure of a simulation model corresponding to the system 10 of FIG. 2. The synapse 11 is connected between a pre-neuron circuit N1 and post neuron circuit N2. Each neuron N1, N2 receives a stimulus input (indicated as "N1input" and "N2input"), and is modelled by the simple circuitry indicated in the enlargement. This includes a summation circuit for summing the dendrite inputs, and a threshold circuit for comparing the sum with a pre-set threshold T. The neuron circuit outputs a series of action signal pulses while the threshold is exceeded, and produces no output otherwise. The inputs and outputs of each neuron are supplied for display as indicated, and the results are illustrated in FIG. 6. This shows each neuron firing a series of output pulses during a different set of time periods for which its summed input exceeds the threshold. FIG. 7a indicates the resulting voltage signals applied between the upper electrode 17 and lower electrode 18 of the PCM cell 15 of synapse 11 in the simulation. FIG. 7b indicates how the resistance of PCM cell 15 varies with these input signals. The synaptic output signal generated at output terminal 23 varies according to the PCM cell resistance. It can be seen that, when either neuron fires alone, the resistance is unchanged. However, during the period for which both neurons fire together, successive pulses produce a gradual decrease in cell resistance (corresponding to increased synaptic weight) between maximum and minimum values. The synaptic output is propagated only when the pre-neuron N1 is firing.

Figure 8:
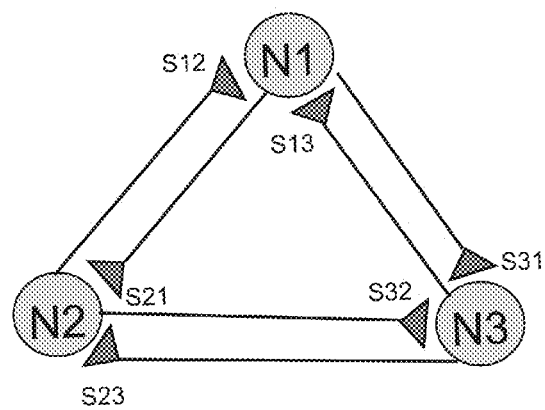
FIG. 8 is a schematic illustration of a synapse system embodying the invention for testing associative memory functionality.
Figure 9:
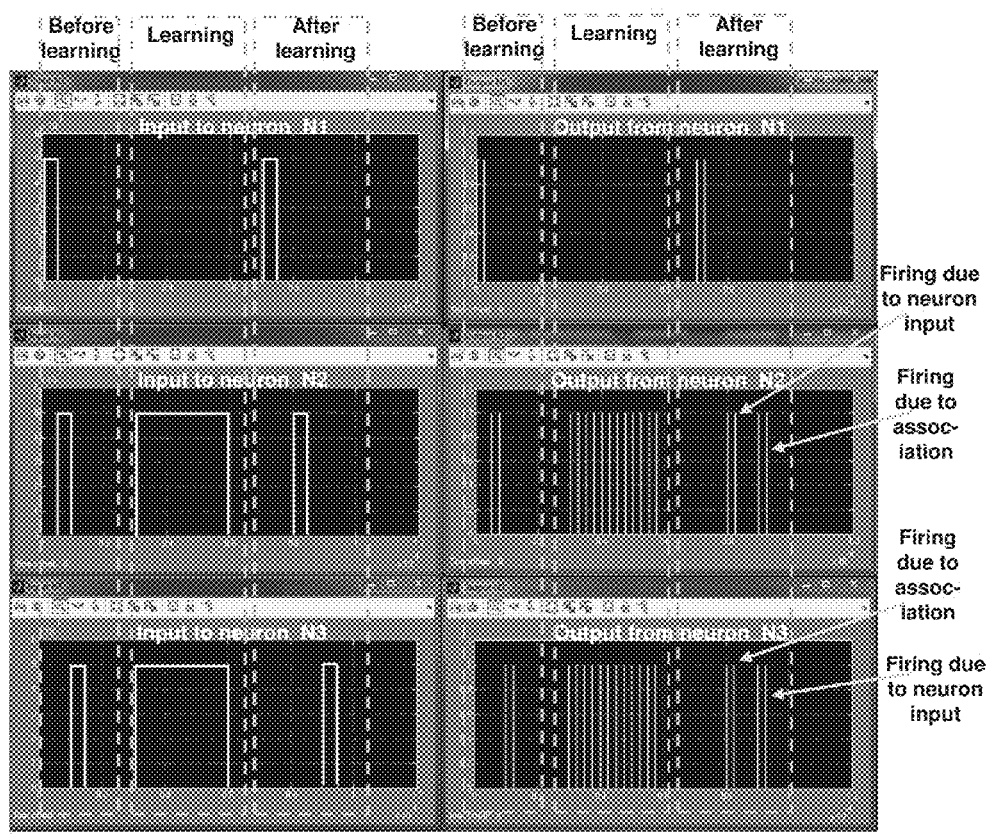
FIG. 9 illustrates neuron inputs and outputs in operation of a simulation model for the FIG. 8 system.

FIG. 8 illustrates a simple system for testing associative memory functionality with synapses embodying the invention. The diagram represents a simple associative memory system with three neurons N1 to N3. Each neuron provides outputs to all other neurons, with synapses Sxy propagating outputs from a pre-neuron Ny to a post-neuron Nx. FIG. 9 shows screen-shots of the stimulus inputs and resulting outputs of neuron circuits N1 to N3 in a simulation model for the FIG. 8 system with synapses 11 embodying the invention. The regions of each display corresponding to signals before, during and after learning are indicated by the labelled columns. It can be seen that, before learning, only neurons with inputs exceeding the threshold fire. During learning, neurons that fire together modify the synaptic strength between them. After learning, the synaptic strength of neurons N2 and N3 has been increased due to concurrent firing. Each of these neurons then fires when either its input exceeds the threshold or the associated neuron fires. This shows effective learning for implementation of associative memory.

With the synapse 11 described above, a programming signal is applied to the cell 15 during the period of simultaneous application of write portions V1W and V2W at the input terminals. A programming signal is thus generated if there is at least partial overlap in the time periods during which V1W and V2W are applied. In addition, the programming signal is dependent on shape of the write portion V2W here. These features can be exploited in neuromorphic systems embodying the invention to emulate STDP effects in which synaptic potentiation/depression can be induced depending on relative timing of the action signals. In particular, it is known that pre-synaptic activity that precedes post-synaptic firing can induce long-term potentiation (LTP), whereas reversing this temporal order causes long-term depression (LTD). Experimentally, the type and amount of long-term synaptic modifications as a function of this relative timing varies in different preparations. A neuromorphic synapse architecture with potentiation and depression characteristics as a function of the firing timing is required to emulate these phenomena. This can be achieved with synapse 11 by using action signals in which the write portion is shaped such that the programming signal varies in dependence on relative timing of the pre- and post-neuron action signals at the input terminals. This is explained below with reference to FIGS. 10 to 17.

Figure 10:
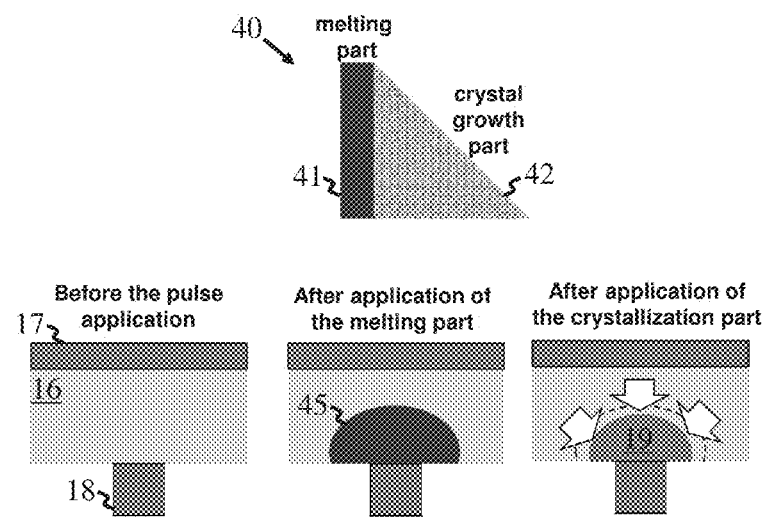
FIG. 10 is a schematic diagram indicating changes in PCM cell-state in response to different regions of a programming pulse.

FIG. 10 illustrates how PCM cell-state can be modified by different regions of a shaped programming pulse. A pulse 40 shown at the top of the figure has a short, high-amplitude melting part 41 and a trailing edge 42 of declining amplitude. The lower section of the figure indicates how the phase-composition of chalcogenide volume 16 in PCM cell 15 varies with application of such a pulse. The left-hand figure shows a wholly-crystalline cell-state before application of the pulse. Application of the melting part 41 forms a molten region 45 as shown in the central figure. Crystallization occurs from the outside of this molten region during the trailing, crystal growth part 42 of the pulse. The resulting thickness of amorphous volume 19 decreases with increasing trailing edge duration.

Figure 11:
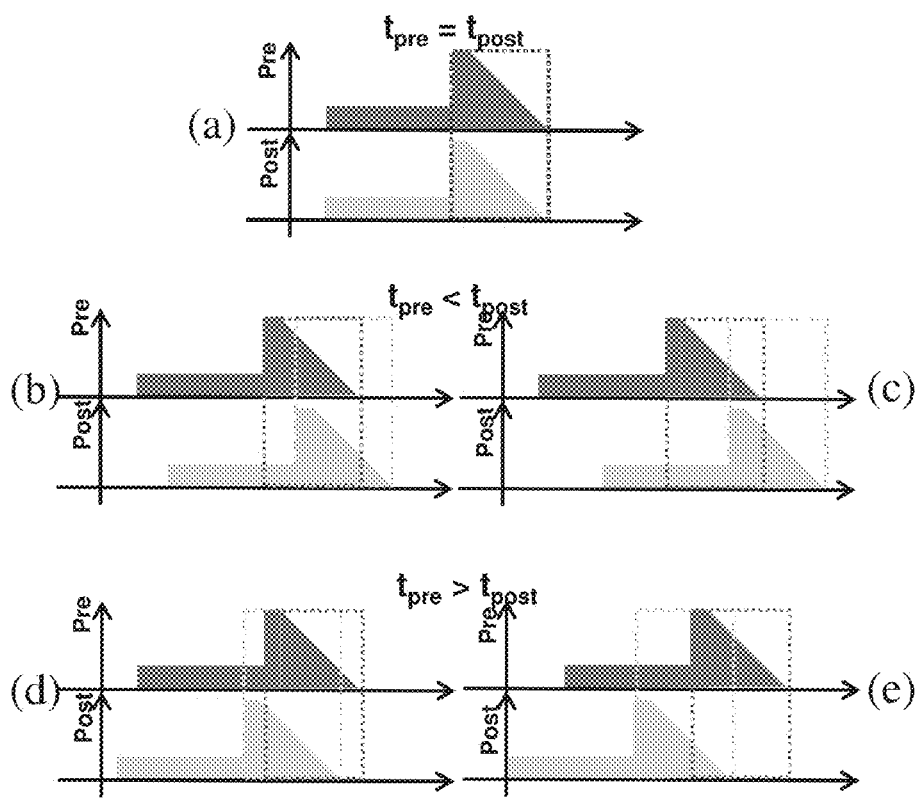
FIG. 11 illustrates different relative timings of pre- and post-neuron action signals having a first write-portion shape.

FIG. 11 indicates different relative timings of pre- and post-neuron action signals at the input terminals of synapse 11. The write portion of these action signals has the pulse shape shown in FIG. 10. Diagram (a) in the top row indicates identically-timed signals (tpre=tpost); diagrams (b) and (c) in the middle row show signals with (tpost−tpre)>0; and diagrams (d) and (e) in the bottom row show signals with (tpost−tpre)<0. In each case, the overlap between the write portions of the action signals, as indicated by the overlapping region of the dotted rectangles in the figures, determines the programming signal applied to the PCM cell 15 in synapse 11. The programming signal corresponds to the part of the post-neuron action signal V2 which is contained in this overlapping region.

Figure 12:
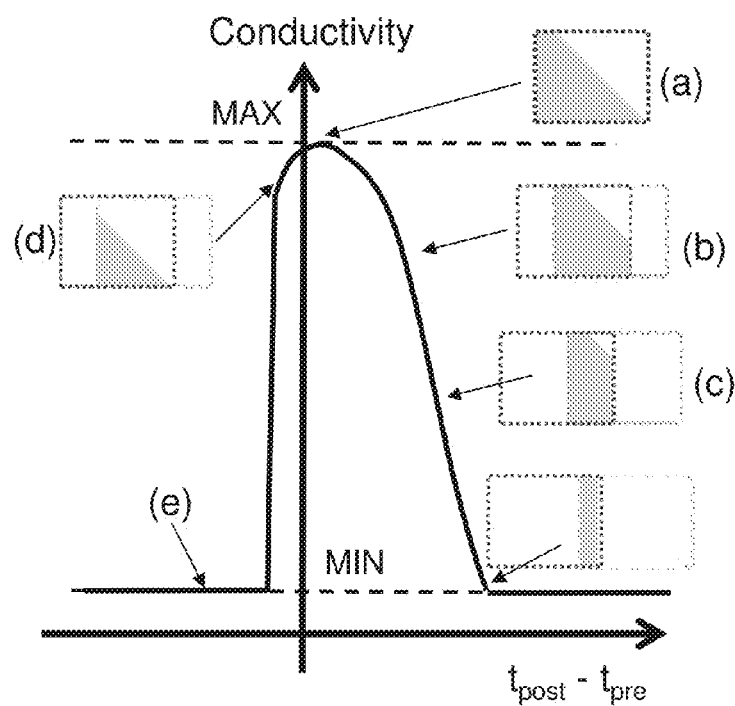
FIG. 12 illustrates how cell conductivity varies in the FIG. 2 circuit with the action signal timings of FIG. 11.

FIG. 12 indicates how cell conductivity varies in the FIG. 2 circuit with the action signal timings of FIG. 11. The cell 15 is initially in the high-resistance amorphous state in this example. The programming signals corresponding to the FIG. 11 timing diagrams are indicated at the appropriate parts of the curve. The point of maximum conductivity corresponds to the identical pulse timing of diagram (a). Here, melting and then crystallization with full trailing edge duration results in maximum crystallization. The programming signals corresponding to diagrams (b) and (c) cause melting and then successively less crystallization according to the partial trailing edge duration. Conductivity therefore gradually decreases with increasing (tpost−tpre) until the programming signal corresponds to the melting part only, giving no crystallization. Beyond this point (no signal overlap), no programming signal is applied and the cell stays in its initial amorphous state. For (tpost−tpre)<0, timing diagram (d) corresponds to substantially no melting and partial crystallization. Beyond this point (diagram (e)) the trailing edge amplitude is insufficient to change the cell-state.

It can be seen that, due to the initial melting part of the write portion shape for this action signal, the material goes into a melting state independent of the initial cell-state. Therefore, the shape of the right side of the curve (Δt>0) is similar regardless of initial cell state. Synaptic potentiation or depression can be induced depending on the relative pulse timing. The left side of the curve (Δt<0), besides a small time interval at the beginning, is mainly defined by the initial state of the cell. The cell-state stays unchanged, here in the initial amorphous state.

Figure 13:
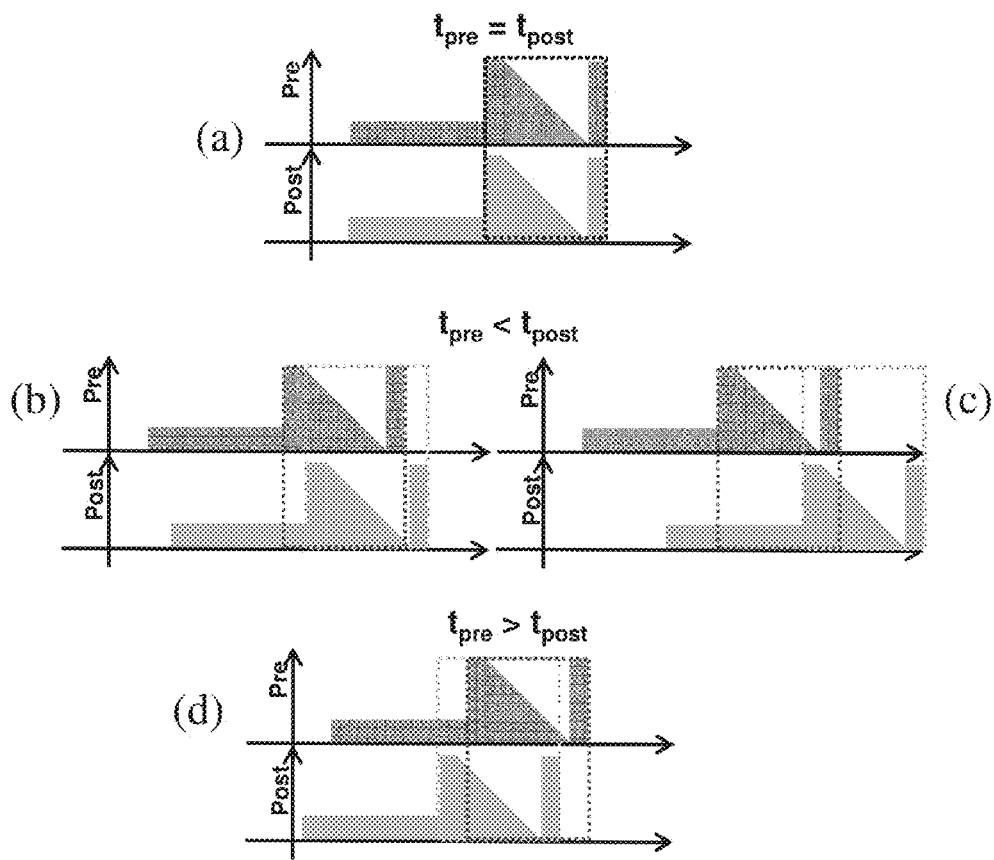
FIG. 13 illustrates different relative timings of pre- and post-neuron action signals having a second write-portion shape.
Figure 14:
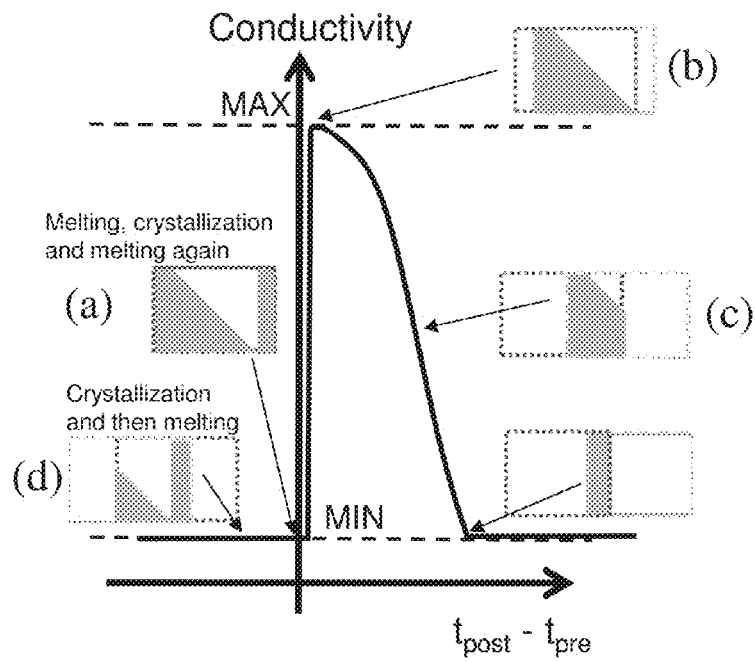
FIG. 14 illustrates how cell conductivity varies in the FIG. 2 system with the action signal timings of FIG. 13.

FIG. 13 shows timing diagrams similarly to FIG. 11, but for action signals in which the write portion has an additional melting part at the end of the trailing edge. FIG. 14 indicates the corresponding conductivity curve. The difference between use of this pulse shape and that of FIG. 11 lies mainly in the left side of the curve (Δt<0). Here the cell goes into the amorphous state independent of the initial cell-state due to the melting part at the end of the write portion. This feature is beneficial because the synapse will be depressed when tpost comes before tpre independent of the current synapse weight.

Figure 15:
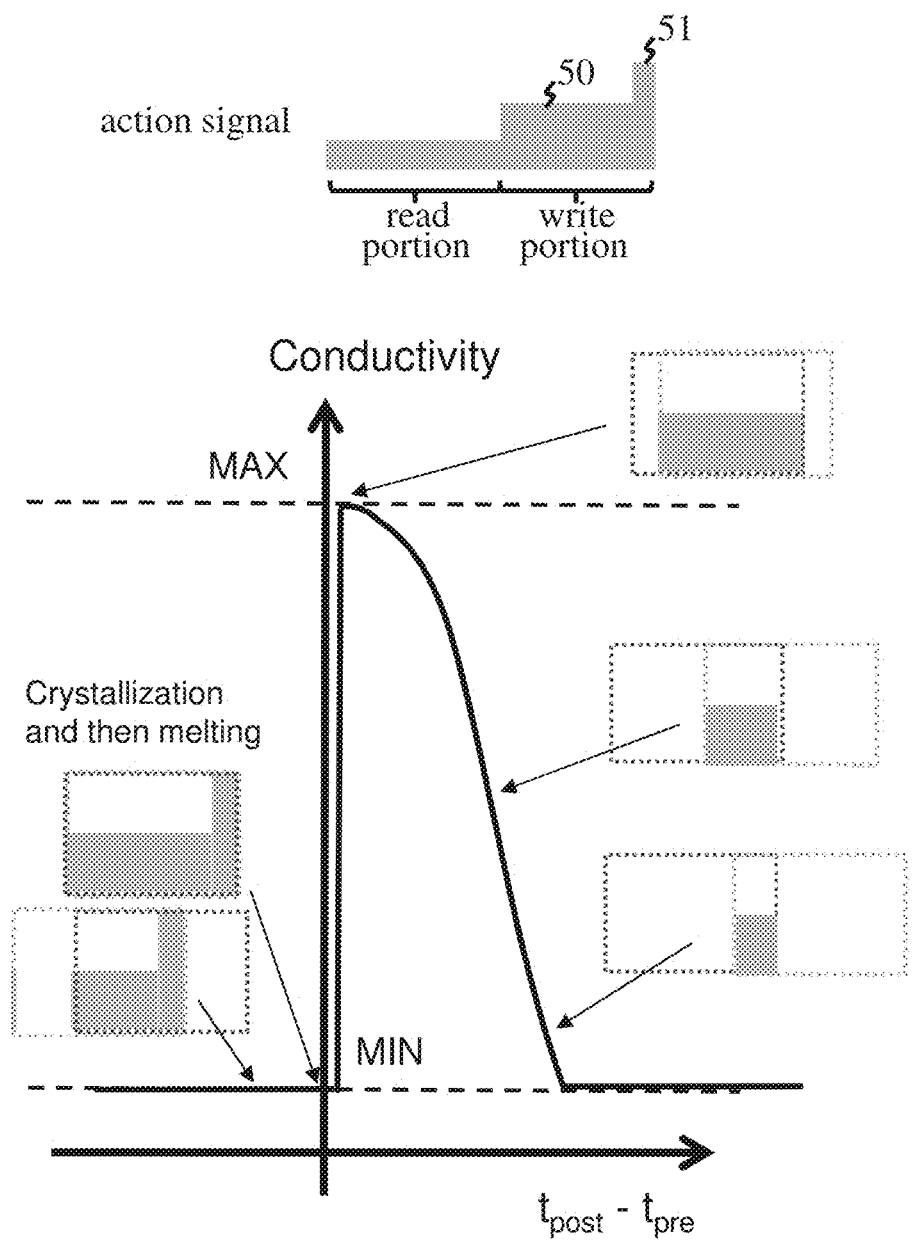
FIG. 15 illustrates how cell conductivity varies in the FIG. 2 system using action signals with another write-portion shape.

FIG. 15 indicates a conductivity curve obtained with the alternative action signal shape shown at the top of the figure. Here, the write portion has a constant-amplitude crystallization part 50 followed by a melting part 51. Programming signals corresponding to different points on the curve are indicated as before. The point of maximum conductivity is obtained when the programming signal corresponds to crystallization part 50, giving the maximum time for crystallization. Decreasing duration of the programming pulse reduces the amount of crystallization as (tpost−tpre) increases. The difference between use of this action signal shape and that of FIG. 13 lies mainly in the right side of the curve (Δt>0). As there is no initial melting part in the write portion, the pulses applied on the right side of the curve are mainly crystallization pulses. Therefore, the conductivity values obtained on the right side of the curve depend on the initial state of the cell. (The curve shown here corresponds to an initial amorphous cell-state). This feature is useful because the synapse will have the accumulation characteristic whereby successive similar events will progressively modify the synaptic strength.

Figure 16:
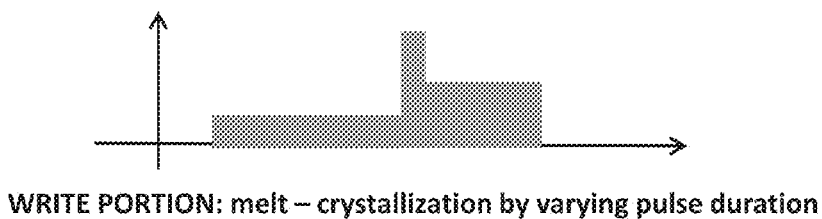
FIG. 16 illustrates an alternative shapes for action signals in the FIG. 2 system.
Figure 17:
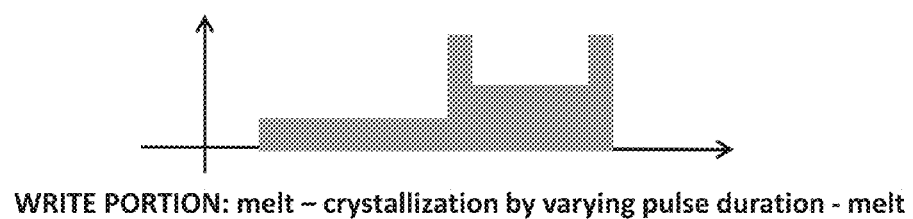
FIG. 17 illustrates another alternative shapes for action signals in the FIG. 2 system.

The above illustrates that the programming signal can be made to depend in various ways on relative timing of the action signals by appropriate shaping of the write portion. The write portion can have a variety of shapes by combining different parts with different durations and amplitude profiles. As further examples, FIGS. 16 and 17 show alternatives to the pulse-shapes of FIGS. 11 and 13 in which the crystallization part has a constant amplitude. In general, combinations of different crystallization and melting parts can be used to obtain differently-shaped STDP curves. The crystallization parts could also comprise a sequence of shorter pulses to enable operation with biological timescales.

While various embodiments have been described above, many changes and modifications can of course be envisaged. By way of example, the switch S2 in the FIG. 2 circuit could be driven closed by the write portion V1W of the pre-neuron action signal instead of the post-neuron action signal. Circuit operation would be otherwise as before but the post-neuron would not then need to disable its input during V2W.

Where a component is described herein as connected to another component, in general such components may be connected directly or indirectly, e.g. via intervening components, unless otherwise indicated.

Resistive memory cells other than PCM cells may of course be employed in synapses embodying the invention. Further, while it is highly desirable for the synapse to operate with identical pre- and post-neuron action signals, the synapse circuitry could of course be adapted, through appropriate selection of components and circuit arrangement, to operate as required in response to pre- and post-neuron action signals which are not identical.

It will be appreciated that many other changes and modifications can be made to the exemplary embodiments described without departing from the scope of the invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A neuromorphic synapse array comprising:
a plurality of neuromorphic synapses each having a resistive memory cell connected by circuitry comprising:
first and second input terminals for respectively receiving pre-neuron and post-neuron action signals each having a read portion and a write portion; and
an output terminal for providing a synaptic output signal dependent on resistance of the resistive memory cell;
the circuitry being configured such that said synaptic output signal is provided at the output terminal in response to application at the first input terminal of the read portion of the pre-neuron action signal, and such that a programming signal, for programming resistance of the memory cell, is applied to the cell in response to simultaneous application of the write portions of the pre-neuron and post-neuron action signals at the first and second input terminals respectively,
wherein each of the plurality of neuromorphic synapses are assigned to a logic row and a logic column of the neuromorphic synapse array, and the first input terminals of neuromorphic synapses in each logic column are connected to a respective pre-neuron line for supplying a pre-neuron action signal, the second input terminals of neuromorphic synapses in each logic row are connected to a respective post-neuron line for supplying a post-neuron action signal, and
wherein a single pre-neuron action signal serves as the pre-neuron action signal for neuromorphic synapses in a given logic column and as the post-neuron action signal for a given logic row.

2. The neuromorphic synapse of claim 1, wherein said circuitry is adapted for operation with identical pre-neuron and post-neuron action signals.

3. The neuromorphic synapse of claim 1, wherein said circuitry is adapted such that the programming signal is applied to the cell during the period of simultaneous application of said write portions at the input terminals.

4. The neuromorphic synapse of claim 1, wherein said circuitry is adapted such that the programming signal is dependent on shape of the write portion of at least one of the pre-neuron and post-neuron action signals at the input terminals.

5. The neuromorphic synapse of claim 1, wherein said circuitry includes a switch set, configurable in dependence on at least one of the action signals, such that the circuitry selectively effects application of said programming signal to the memory cell and provision of said synaptic output signal at the output terminal.

6. The neuromorphic synapse of claim 5, wherein said switch set comprises first and second switches.

7. The neuromorphic synapse of claim 6, wherein:
the circuitry includes a first resistance connected between the first input terminal and a first electrode of the memory cell, and a second resistance connected between a second electrode of the memory cell and a reference terminal;
the output terminal is connected to the second electrode of the memory cell;
the first switch is connected between the second electrode and the reference terminal in parallel to the second resistance; and
the second switch is connected between the second input terminal and the first electrode of the memory cell.

8. The neuromorphic synapse of claim 7, wherein the circuitry is adapted such that the first switch is closed during the write portion of the pre-neuron action signal, and the second switch is closed during the write portion of one of the pre-neuron and post-neuron action signals.

9. The neuromorphic synapse of claim 7, wherein the first and second resistances are adapted to inhibit programming of the memory cell in response to application of only one of the pre-neuron and post-neuron action signals at the input terminals.

10. The neuromorphic synapse of claim 7, wherein the memory cell comprises a phase-change memory cell.

11. A neuromorphic synapse array comprising:
a plurality of neuromorphic synapses each having a resistive memory cell connected by circuitry, wherein the synapses are assigned to logical rows and logical columns of the neuromorphic synapse array;
the circuitry comprising:
first and second input terminals for respectively receiving pre-neuron and post-neuron action signals each having a read portion and a write portion; and
an output terminal for providing a synaptic output signal dependent on resistance of the resistive memory cell; and
the circuitry being configured such that said synaptic output signal is provided at the output terminal in response to application at the first input terminal of the read portion of the pre-neuron action signal, and such that a programming signal, for programming resistance of the memory cell, is applied to the cell in response to simultaneous application of the write portions of the pre-neuron and post-neuron action signals at the first and second input terminals respectively; and
the first input terminals of synapses in each column are connected to a respective pre-neuron line for supplying a pre-neuron action signal from a corresponding pre-neuron circuit in use;
the second input terminals of synapses in each row are connected to a respective post-neuron line for supplying a post-neuron action signal from a corresponding post-neuron circuit in use; and
the output terminals of synapses in each row are arranged for connection to said corresponding post-neuron circuit for supplying synaptic output signals to that circuit in use,
wherein a single pre-neuron action signal serves as the pre-neuron action signal for neuromorphic synapses in a given logical column and as the post-neuron action signal for a given logical row.

12. The neuromorphic synapse array of claim 11, wherein said circuitry is adapted for operation with identical pre-neuron and post-neuron action signals.

13. The neuromorphic synapse array of claim 11, wherein said circuitry is adapted such that the programming signal is applied to the cell during the period of simultaneous application of said write portions at the input terminals.

14. The neuromorphic synapse array of claim 11, wherein said circuitry is adapted such that the programming signal is dependent on shape of the write portion of at least one of the pre-neuron and post-neuron action signals at the input terminals.

15. The neuromorphic synapse array of claim 11, wherein said circuitry includes a switch set, configurable in dependence on at least one of the action signals, such that the circuitry selectively effects application of said programming signal to the memory cell and provision of said synaptic output signal at the output terminal.

16. The neuromorphic synapse array of claim 15, wherein said switch set comprises first and second switches.

17. The neuromorphic synapse array of claim 16, wherein:
- the circuitry includes a first resistance connected between the first input terminal and a first electrode of the memory cell, and a second resistance connected between a second electrode of the memory cell and a reference terminal;
- the output terminal is connected to the second electrode of the memory cell;
- the first switch is connected between the second electrode and the reference terminal in parallel to the second resistance; and
- the second switch is connected between the second input terminal and the first electrode of the memory cell.

18. The neuromorphic synapse array of claim 17, wherein the circuitry is adapted such that the first switch is closed during the write portion of the pre-neuron action signal, and the second switch is closed during the write portion of one of the pre-neuron and post-neuron action signals.

19. The neuromorphic synapse array of claim 17, wherein the first and second resistances are adapted to inhibit programming of the memory cell in response to application of only one of the pre-neuron and post-neuron action signals at the input terminals.

* * * * *